(12) United States Patent
Farrar (10) Patent No.: US 7,387,912 B2
(45) Date of Patent: Jun. 17, 2008

(54) PACKAGING OF ELECTRONIC CHIPS WITH AIR-BRIDGE STRUCTURES

(75) Inventor: Paul A. Farrar, So. Burlington, VT (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/216,486

(22) Filed: Aug. 31, 2005

(65) Prior Publication Data

US 2005/0285220 A1  Dec. 29, 2005

Related U.S. Application Data

(62) Division of application No. 10/931,510, filed on Sep. 1, 2004, which is a division of application No. 09/382,929, filed on Aug. 25, 1999.

(51) Int. Cl.
*H01L 21/44* (2006.01)
*H01L 21/4763* (2006.01)

(52) U.S. Cl. .................. 438/115; 438/599; 438/619; 438/623; 438/666; 438/669; 438/687; 438/977

(58) Field of Classification Search .............. None
See application file for complete search history.

(56) References Cited

U.S. PATENT DOCUMENTS

| | | | |
|---|---|---|---|
| 1,254,987 A | 1/1918 | Cooper | |
| 1,976,375 A | 10/1934 | Smith | |
| 2,244,608 A | 6/1941 | Cooper | |
| 3,147,110 A | 9/1964 | Foerster | |
| 3,337,334 A | 8/1967 | Fenn et al. | |
| 3,506,438 A | 4/1970 | Krock et al. | |

(Continued)

FOREIGN PATENT DOCUMENTS

EP  578856 A1  7/1992

(Continued)

OTHER PUBLICATIONS

"ACCUSPIN T-18 Flowable Spin-On Polymer (SOP)", *AlliedSignal—Advanced Microelectronic Materials*, Sunnyvale, CA,(Jul. 1998),1-2.

(Continued)

*Primary Examiner*—David E Graybill
(74) *Attorney, Agent, or Firm*—Schwegman, Lundberg & Woessner, P.A.

(57) ABSTRACT

A circuit assembly for fabricating an air bridge structure and a method of fabricating an integrated circuit package capable of supporting a circuit assembly including an air bridge structure. A circuit assembly comprises an electronic chip and a conductive structure embedded in a plurality of materials having a plurality of vaporization temperatures. The plurality of materials is formed on the electronic chip and the conductive structure is coupled to the electronic chip. To fabricate the circuit assembly, a support structure, including interstices, is formed on an electronic chip. The interstices of the support structure are filled with a material having a vaporization temperature that is less than the vaporization temperature of the support structure. Conductive structures are embedded in the support structure and the material, and a connective structure is mounted on the support structure. Finally, the material is removed from the interstices by heating the circuit assembly.

26 Claims, 6 Drawing Sheets

U.S. PATENT DOCUMENTS

| | | | |
|---|---|---|---|
| 3,548,915 A | 12/1970 | Richmond et al. | |
| 3,548,948 A | 12/1970 | Richmond et al. | |
| 3,687,737 A | 8/1972 | Krock et al. | |
| 3,956,195 A | 5/1976 | Topchiashvili et al. | |
| 4,009,799 A | 3/1977 | Fathauer | |
| 4,368,350 A | 1/1983 | Perelman | |
| 4,389,429 A | 6/1983 | Soclof | |
| 4,561,173 A | 12/1985 | Te Velde | |
| 4,577,212 A * | 3/1986 | Hueckel et al. | 257/767 |
| 4,599,136 A | 7/1986 | Araps et al. | |
| 4,663,535 A | 5/1987 | Nakai et al. | |
| 4,673,589 A * | 6/1987 | Standley | 427/577 |
| 4,705,659 A | 11/1987 | Bernstein et al. | |
| 4,725,562 A | 2/1988 | El-Kareh et al. | |
| 4,734,820 A | 3/1988 | Lauffer et al. | |
| 4,749,621 A | 6/1988 | Araps et al. | |
| 4,770,897 A | 9/1988 | Wu | |
| 4,912,548 A | 3/1990 | Shanker et al. | |
| 4,962,058 A | 10/1990 | Cronin et al. | |
| 4,980,754 A | 12/1990 | Kotani et al. | |
| 4,988,581 A | 1/1991 | Wycliffe | |
| 4,992,764 A | 2/1991 | Ayasli | |
| 5,084,750 A | 1/1992 | Adlerstein | |
| 5,098,856 A | 3/1992 | Beyer et al. | |
| 5,103,288 A | 4/1992 | Sakamoto et al. | |
| 5,128,382 A | 7/1992 | Elliott, Jr. et al. | |
| 5,137,780 A | 8/1992 | Nichols et al. | |
| 5,158,986 A | 10/1992 | Cha et al. | |
| 5,171,713 A * | 12/1992 | Matthews | 438/31 |
| 5,173,442 A | 12/1992 | Carey | |
| 5,191,404 A | 3/1993 | Wu et al. | |
| 5,202,573 A | 4/1993 | Shirai | |
| 5,223,454 A | 6/1993 | Uda et al. | |
| 5,227,103 A | 7/1993 | Muschiatti | |
| 5,264,375 A | 11/1993 | Bang et al. | |
| 5,268,587 A | 12/1993 | Murata et al. | |
| 5,303,555 A | 4/1994 | Chrysler et al. | |
| 5,311,465 A | 5/1994 | Mori et al. | |
| 5,324,683 A | 6/1994 | Fitch et al. | |
| 5,324,684 A | 6/1994 | Kermani et al. | |
| 5,334,356 A | 8/1994 | Baldwin et al. | |
| 5,336,914 A | 8/1994 | Andoh | |
| 5,404,046 A | 4/1995 | Matsumoto et al. | |
| 5,408,742 A | 4/1995 | Zaidel et al. | |
| 5,438,539 A | 8/1995 | Mori | |
| 5,444,105 A | 8/1995 | Ornstein | |
| 5,457,334 A | 10/1995 | Nishimoto | |
| 5,461,003 A | 10/1995 | Havemann et al. | |
| 5,470,693 A | 11/1995 | Sachdev et al. | |
| 5,470,802 A | 11/1995 | Gnade et al. | |
| 5,473,814 A | 12/1995 | White | |
| 5,480,048 A | 1/1996 | Kitamura et al. | |
| 5,488,015 A | 1/1996 | Havemann et al. | |
| 5,500,078 A | 3/1996 | Lee | |
| 5,510,645 A | 4/1996 | Fitch et al. | |
| 5,519,239 A | 5/1996 | Chu | |
| 5,548,159 A | 8/1996 | Jeng | |
| 5,552,638 A | 9/1996 | O'Connor et al. | |
| 5,554,870 A | 9/1996 | Fitch et al. | |
| 5,554,875 A | 9/1996 | Hartauer | |
| 5,578,146 A | 11/1996 | Grant et al. | |
| 5,591,676 A | 1/1997 | Hughes et al. | |
| 5,593,926 A | 1/1997 | Fujihira | |
| 5,646,526 A | 7/1997 | Takeda et al. | |
| 5,673,561 A | 10/1997 | Moss | |
| 5,677,887 A | 10/1997 | Ishibashi et al. | |
| 5,691,565 A | 11/1997 | Manning | |
| 5,701,666 A | 12/1997 | DeHaven et al. | |
| 5,702,984 A | 12/1997 | Bertin et al. | |
| 5,725,689 A | 3/1998 | Nishida et al. | |
| 5,744,865 A | 4/1998 | Jeng et al. | |
| 5,747,880 A | 5/1998 | Havemann et al. | |
| 5,773,363 A | 6/1998 | Derderian et al. | |
| 5,780,121 A | 7/1998 | Endo | |
| 5,780,928 A | 7/1998 | Rostoker et al. | |
| 5,784,328 A | 7/1998 | Irrinki et al. | |
| 5,786,630 A | 7/1998 | Bhansali et al. | |
| 5,789,762 A | 8/1998 | Koyama et al. | |
| 5,798,200 A | 8/1998 | Matsuura et al. | |
| 5,801,412 A | 9/1998 | Tobita | |
| 5,804,607 A | 9/1998 | Hedrick et al. | |
| 5,821,621 A | 10/1998 | Jeng | |
| 5,830,923 A | 11/1998 | Venkataraman | |
| 5,831,266 A | 11/1998 | Jerominek et al. | |
| 5,844,317 A | 12/1998 | Bertolet et al. | |
| 5,869,880 A | 2/1999 | Grill et al. | |
| 5,879,787 A | 3/1999 | Petefish | |
| 5,880,030 A * | 3/1999 | Fang et al. | 438/701 |
| 5,883,009 A | 3/1999 | Villa et al. | |
| 5,886,410 A * | 3/1999 | Chiang et al. | 257/759 |
| 5,891,797 A | 4/1999 | Farrar | |
| 5,923,074 A | 7/1999 | Jeng | |
| 5,926,732 A | 7/1999 | Matsuura | |
| 5,935,868 A * | 8/1999 | Fang et al. | 438/692 |
| 5,949,144 A | 9/1999 | Delgado et al. | |
| 5,953,626 A | 9/1999 | Hause et al. | |
| 5,962,909 A * | 10/1999 | Jerominek et al. | 257/522 |
| 5,994,777 A | 11/1999 | Farrar | |
| 6,004,442 A | 12/1999 | Choulga et al. | |
| 6,023,125 A | 2/2000 | Yoshikawa et al. | |
| 6,025,015 A | 2/2000 | Landry-Coltrain et al. | |
| 6,027,995 A * | 2/2000 | Chiang et al. | 438/623 |
| 6,028,348 A | 2/2000 | Hill | |
| 6,033,951 A | 3/2000 | Chao | |
| 6,037,245 A | 3/2000 | Matsuda | |
| 6,037,249 A | 3/2000 | Chiang et al. | |
| 6,040,628 A | 3/2000 | Chiang et al. | |
| 6,043,146 A | 3/2000 | Watanabe et al. | |
| 6,051,869 A * | 4/2000 | Pan et al. | 257/506 |
| 6,065,131 A | 5/2000 | Andrews et al. | |
| 6,071,600 A | 6/2000 | Rosenmayer | |
| 6,077,792 A | 6/2000 | Farrar | |
| 6,091,630 A | 7/2000 | Chan et al. | |
| 6,094,715 A | 7/2000 | Wilkinson et al. | |
| 6,130,140 A | 10/2000 | Gonzalez | |
| 6,140,200 A | 10/2000 | Eldridge | |
| 6,143,647 A * | 11/2000 | Pan et al. | 438/637 |
| 6,156,374 A | 12/2000 | Forbes et al. | |
| 6,165,890 A | 12/2000 | Kohl et al. | |
| 6,172,305 B1 | 1/2001 | Tanahashi | |
| 6,177,329 B1 | 1/2001 | Pang | |
| 6,212,314 B1 | 4/2001 | Ford | |
| 6,214,716 B1 | 4/2001 | Akram | |
| 6,222,216 B1 | 4/2001 | Rao et al. | |
| 6,232,140 B1 | 5/2001 | Ferrari et al. | |
| 6,233,184 B1 | 5/2001 | Barth et al. | |
| 6,239,019 B1 * | 5/2001 | Chiang et al. | 438/624 |
| 6,245,658 B1 | 6/2001 | Buynoski | |
| 6,245,661 B1 | 6/2001 | Matsumoto et al. | |
| 6,251,470 B1 | 6/2001 | Forbes et al. | |
| 6,255,712 B1 | 7/2001 | Clevenger et al. | |
| 6,265,303 B1 | 7/2001 | Lu et al. | |
| 6,268,630 B1 | 7/2001 | Schwank et al. | |
| 6,268,637 B1 | 7/2001 | Gardner et al. | |
| 6,274,920 B1 | 8/2001 | Park et al. | |
| 6,287,979 B1 | 9/2001 | Zhou et al. | |
| 6,291,891 B1 | 9/2001 | Higashi et al. | |
| 6,303,487 B1 | 10/2001 | Kagamihara | |
| 6,307,194 B1 | 10/2001 | Fitzgibbons et al. | |
| 6,309,956 B1 | 10/2001 | Chiang et al. | |
| 6,313,046 B1 | 11/2001 | Juengling et al. | |
| 6,313,518 B1 | 11/2001 | Ahn et al. | |
| 6,318,124 B1 | 11/2001 | Rutherford et al. | |
| 6,323,125 B1 | 11/2001 | Soo et al. | |

| | | |
|---|---|---|
| 6,331,480 B1 | 12/2001 | Tsai et al. |
| 6,333,556 B1 | 12/2001 | Juengling et al. |
| 6,342,454 B1 | 1/2002 | Hawker et al. |
| 6,350,672 B1 | 2/2002 | Sun |
| 6,380,294 B1 | 4/2002 | Babinec et al. |
| 6,392,306 B1 | 5/2002 | Khandros et al. |
| 6,413,827 B2 | 7/2002 | Farrar |
| 6,420,261 B2 | 7/2002 | Kudo |
| 6,420,441 B1 | 7/2002 | Allen et al. |
| 6,433,413 B1 | 8/2002 | Farrar |
| 6,438,720 B1 | 8/2002 | Boutaud et al. |
| 6,484,065 B1 | 11/2002 | Yu |
| 6,501,179 B2 | 12/2002 | Juengling et al. |
| 6,503,818 B1 | 1/2003 | Jang |
| 6,512,013 B2 | 1/2003 | Hrivnak |
| 6,574,968 B1 | 6/2003 | Symko et al. |
| 6,577,011 B1 | 6/2003 | Buchwalter et al. |
| 6,614,092 B2 | 9/2003 | Eldridge et al. |
| 6,624,454 B1 | 9/2003 | Adachi |
| 6,628,355 B1 | 9/2003 | Takahara |
| 6,667,219 B1 | 12/2003 | Eldridge |
| 6,670,257 B1 | 12/2003 | Barlocchi et al. |
| 6,670,714 B1 | 12/2003 | Miyamoto et al. |
| 6,670,719 B2 | 12/2003 | Eldridge et al. |
| 6,674,167 B1 | 1/2004 | Ahn et al. |
| 6,679,315 B2 | 1/2004 | Cosley et al. |
| 6,686,654 B2 | 2/2004 | Farrar et al. |
| 6,709,968 B1 | 3/2004 | Eldridge et al. |
| 6,725,670 B2 | 4/2004 | Smith et al. |
| 6,734,562 B1 | 5/2004 | Farrar |
| 6,744,136 B2 | 6/2004 | Dubhashi |
| 6,747,347 B2 | 6/2004 | Farrar et al. |
| 6,756,653 B2 | 6/2004 | Farrar |
| 6,781,192 B2 | 8/2004 | Farrar |
| 6,808,015 B2 | 10/2004 | Osakabe |
| 6,836,291 B1 | 12/2004 | Nakamura et al. |
| 6,838,764 B2 | 1/2005 | Farrar |
| 6,861,287 B2 | 3/2005 | Farrar et al. |
| 6,872,671 B2 | 3/2005 | Farrar |
| 6,890,847 B1 | 5/2005 | Farrar |
| 6,953,983 B2 | 10/2005 | Farrar |
| 6,979,848 B2 | 12/2005 | Farrar |
| 6,992,888 B1 | 1/2006 | Iyer |
| 6,994,151 B2 | 2/2006 | Zhou et al. |
| 7,035,104 B2 | 4/2006 | Meyer |
| 7,067,421 B2 | 6/2006 | Ahn et al. |
| 7,095,111 B2 | 8/2006 | Hu et al. |
| 7,112,542 B2 * | 9/2006 | Juengling et al. ........... 438/782 |
| 7,202,562 B2 | 4/2007 | Farrar |
| 7,215,547 B2 | 5/2007 | Chang et al. |
| 7,276,788 B1 | 10/2007 | Farrar |
| 7,300,821 B2 | 11/2007 | Farrar et al. |
| 2001/0005625 A1 | 6/2001 | Sun |
| 2001/0008172 A1 | 7/2001 | Shoda et al. |
| 2001/0014512 A1 | 8/2001 | Lyons et al. |
| 2001/0014526 A1 | 8/2001 | Clevenger et al. |
| 2001/0019876 A1 | 9/2001 | Juengling et al. |
| 2001/0034117 A1 | 10/2001 | Eldridge et al. |
| 2001/0050438 A1 | 12/2001 | Juengling et al. |
| 2002/0019125 A1 | 2/2002 | Juengling et al. |
| 2002/0037603 A1 | 3/2002 | Eldridge et al. |
| 2002/0094651 A1 | 7/2002 | Farrar |
| 2002/0142590 A1 | 10/2002 | Pan et al. |
| 2003/0123225 A1 | 7/2003 | Miller |
| 2004/0000150 A1 | 1/2004 | Symko et al. |
| 2005/0029663 A1 | 2/2005 | Farrar |
| 2005/0111186 A1 | 5/2005 | Chiou |
| 2006/0046322 A1 | 3/2006 | Farrar et al. |
| 2006/0118949 A1 | 6/2006 | Farrar |
| 2006/0119224 A1 | 6/2006 | Keolian et al. |
| 2006/0238187 A1 | 10/2006 | Farrar |
| 2006/0244112 A1 | 11/2006 | Farrar |
| 2006/0249837 A1 | 11/2006 | Farrar et al. |
| 2006/0261484 A1 | 11/2006 | Farrar |
| 2007/0023894 A1 | 2/2007 | Farrar |
| 2007/0042595 A1 | 2/2007 | Farrar |

FOREIGN PATENT DOCUMENTS

| | | | |
|---|---|---|---|
| GB | | 2158995 A | 11/1985 |

OTHER PUBLICATIONS

American Society for Metals, "Metals Handbook", *Properties and Selection: Nonferrous Alloys and Pure Metals*, Ninth Edition, vol. 2, Metals Park, Ohio :,(1979),796-797.

Bhusari, Dhananjay, "Fabrication of Air-Channel Structures for Microfluidic, Microelecromechanical, and Microelectonic Applications", *Journal of Microelectromechanical Systems*, 10 (3), (Sep. 2001),400-408.

Conti, R., et al., "Processing Methods to Fill High Aspect Ratio Gaps Without Premature Constriction", *1999 Proceedings of Dielectrics for Multilevel Interconnection Conference*, (1999), 201-209.

Craig, J. D., "Polymide Coatings", *Packaging, Electronic Materials Handbook*, vol. 1, ASM International Handbook Committee (eds.), ASM International, Materials Park, OH,(1989),767-772.

Labadie, J., et al., "Nanopore Foams of High Temperature Polymers", *IEEE Transactions on Components, Hybrids, and Manufacturing Technology*, 15, (Dec. 1992),925-930.

Remenar, J., et al., "Templating Nanopores into Poly (Methysilsesquioxane): New-Low Dielectric Coatings Suitable for Microelectronic Applications", *Materials Research Society Symposium Proceedings*, 511, (1998),69-74.

Grove, N. R., et al., "Properties and Processing of AVATREL as a High Performance Dielectric", *Mat. Res. Soc. Symp. Proc.* vol. 476, 1997 Materials Research Society,(May 1997),224-227.

"'Green' Chiller Technology Rolled Out For Earth Day", *Penn State News Release*, http://www.sciencedaily.com/releases/2004/04/040421232304.htm, (Apr. 22, 2004).

"Fundamentals of Sonic Cleaning", http://www.icknowledge.com/misc_technoloy/Megasonic.pdf, (Archived Apr. 20, 2003),1 page.

"Megasonics—Sage Solvent Alternatives Guide", http://clean.rti.org/alt.cfm?id=me&cat=ov, Research Triangle Institute,(Mar. 15, 1995).

"Packaging", *Electronic Materials Handbook*, vol. 1, ASM International,(1989),pp. 105, 768-769.

"Sacrificial Underlayer Airbridge Formation", *Simon Frazer University*, MWD CSTC, (Aug. 1999).

"What is megasonics cleaning?", http://www.prosysmeg.com/technology/articles/megasonics_cleaning.php, ProSys, Inc., (Copyright 1997-2004).

American Society for Metals, "Metals Handbook", *Properties and Selection: Nonferrous Alloys and Pure Metals*, Ninth Edition, vol. 2, Metals Park, Ohio:,(1979), 157, 395.

Ballister, Stephen C., et al., "Shipboard Electronics Thermoacoustic Cooler", Report No. A415003, *Naval Postgraduate School*, Monterey, CA, Abstract,(Jun. 1995).

Blodgett, A J., et al., "Thermal Conduction Module: A High-Performance Multilayer Ceramic Package", *IBM Journal of Research and Development*, 26(1), (1982),30-36.

Chiniwalla, P., "Structure-Property Relations for Polynorbornenes", *Proceedings from the Eighth Meeting of the Dupont Symposium on Polymides In Microelectronics*, (1998),pp. 615-642.

Grove, N., et al., "Functionalized Polynorbornene Dielectric Polymers: Adhesion and Mechanical Properties", *Journal of Polymer Science*, (1999),3003-3010.

Jayaraj, K., "Low Dielectric Constant Microcellular Foams", *Proceedings from the Seventh Meeting of the DuPont Symposium on Polymides in Microelectrics*, (Sep. 1996),474-501.

Jin, C., et al., "Porous Xerogel Films as Ultra-low Permittivity Dielectrics for ULSI Interconnect Applications", *Conference Proceedings ULSI XII—1997 Materials Research Society*, (1997),463-469.

Miller, R. D., "Low Dielectric Constant Polyimides and Polyimide Nanofoams", *Seventh Meeting of the DuPont Symposium on Polymides in Microelectronics*, (Sep. 1996),pp. 443-473.

Ramos, T , et al., "Nanoporous Silica for Dielectric Constant Less Than 2", *Conference Proceedings ULSI XII—1997 Materials Research Society*, (1997),455-461.

Shibasaki, T. , et al., "Process and Application of Fumed Silica AEROSIL", *3rd Annual Workshop on Mechanical Polishing*, Lake Placid, New York,(1998),pp. 1-26.

Singer, Peter , "The New Low-K Candidate: It's a Gas", *Semiconductor International*, 22(3), (Mar. 1999),38.

Singer, P. , "The New Low-k Candidate: It's a Gas", *Semiconductor International*, 22(3), (Mar. 1999),p. 38.

Ting, C. H., "Low K Material/Process Development", *1996 VLSI Multilevel Interconnection State-of-the-Art Seminar*, (Jun. 1996),pp. 171-212.

Van Vlack, Lawrence H., "Elements of Materials Science", *Addison-Wesley Publishing Co., Inc.* Reading, MA, (1959),468.

Vardaman, E. J., "Future Packaging Trends: CSP vs. Flip Chip", *11th European Microelectrics Conference*, Venice, (1997),295-299.

Volksen, W. , et al., "Characterization and Processing Considerations for Methylsilsesquioxane Based Dielectrics", *Proceedings of the Fifth Dielectric for ULSI Multilevel Interconnections*, Santa Clara, CA,(1999),pp. 83-90.

U.S. Appl. No. 09/382524 Amendment and response filed Nov. 13, 2002 to Non final office action mailed Aug. 13, 2002, 8 pgs.

U.S. Appl. No. 09/382524 Amendment Under 37 CFR 1.312 filed Jun. 26, 2007, 3 pgs.

U.S. Appl. No. 09/382524 Non final office action mailed May 05, 2005, 10 pgs.

U.S. Appl. No. 09/382524 Non final office action mailed Jun. 18, 2003, 4 pgs.

U.S. Appl. No. 09/382524 Non final office action mailed Jul. 16, 2001, 9 pgs.

U.S. Appl. No. 09/382524 Non final office action mailed Sep. 13, 2002, 6 pgs.

U.S. Appl. No. 09/382524 Non final office action mailed Oct. 22, 2003, 7 pgs.

U.S. Appl. No. 09/382524 Non final office action mailed Oct 23, 2006, 9 pgs.

U.S. Appl. No. 09/382524 Notice of allowance mailed Feb. 11, 2003, 7 pgs.

U.S. Appl. No. 09/382524 Notice of allowance mailed Mar. 14, 2002, 7 pgs.

U.S. Appl. No. 09/382524 Notice of allowance mailed Mar. 26, 2007, 7 pgs.

U.S. Appl. No. 09/382524 Notice of allowance mailed Apr. 19, 2004, 5 pgs.

U.S. Appl. No. 09/382524 Notice of allowance mailed Nov. 16, 2005, 6 pgs.

U.S. Appl. No. 09/382524 Response filed Jan. 23, 2007 to Non final office action mailed Oct. 23, 2006, 12 pgs.

U.S. Appl. No. 09/382524 Response filed Aug. 05, 2005 to Non final office action mailed May 05, 2005, 8 pgs.

U.S. Appl. No. 09/382524 Response filed Dec. 17, 2003 to Non final office action mailed Oct. 22, 2003, 9 pgs.

U.S. Appl. No. 09/507964 Amendment and response filed May 13, 2003 to Non Final office action mailed Feb. 13, 2003, 9 pgs.

U.S. Appl. No. 09/507964 Amendment and response filed Jul. 28, 2004 to Non Final office action mailed May. 28, 2004, 16 pgs.

U.S. Appl. No. 09/507964 Amendment and response filed Sep. 29, 2003 to Non Final office action mailed Jul. 28, 2003, 14 pgs.

U.S. Appl. No. 09/507964 Amendment and response filed Nov. 14, 2002 to Non Final office action mailed Aug. 14, 2002, 6 pgs.

U.S. Appl. No. 09/507964 Final office action mailed May 28, 2004, 11 pgs.

U.S. Appl. No. 09/507964 Final office action mailed Jul. 28, 2003, 9 pgs.

U.S. Appl. No. 09/507964 Final office action mailed Feb. 13, 2003, 9 pgs.

U.S. Appl. No. 09/507964 Final office action mailed Aug. 14, 2002, 13 pgs.

U.S. Appl. No. 09/507964 Final office action mailed Dec. 15, 2003, 8 pgs.

U.S. Appl. No. 09/507964 Response filed Mar. 15, 2004 to Non Final office action mailed Dec. 15, 2003, 15 pgs.

U.S. Appl. No. 10/179091 Amendment and response filed Jun. 03, 2003 to Non final office action mailed Mar. 03, 2003, 14 pgs.

U.S. Appl. No. 10/179091 Non final office action mailed Mar. 03, 2003, 9 pgs.

U.S. Appl. No. 10/179091 Notice of allowance mailed Jan. 27, 2004, 4 pgs.

U.S. Appl. No. 10/179091 Notice of allowance mailed Aug. 26, 2003, 8 pgs.

U.S. Appl. No. 10/179091 Notice of allowance mailed Oct. 21, 2005, 10 pgs.

U.S. Appl. No. 10/179091 Notice of allowance mailed Dec. 09, 2004, 8 pgs.

U.S. Appl. No. 10/179110 Amendment and response filed Mar. 31, 2003 to Non final office action mailed Dec. 30, 2002, 15 pgs.

U.S. Appl. No. 10/179110 Amendment Under 37 CFR 1.312 filed Oct. 06, 2004, 11 pgs.

U.S. Appl. No. 10/179110 Non final office action mailed Jun. 17, 2003, 6 pgs.

U.S. Appl. No. 10/179110 Non final office action mailed Dec. 11, 2003, 5 pgs.

U.S. Appl. No. 10/179110 Non final office action mailed Dec. 30, 2002, 8 pgs.

U.S. Appl. No. 10/179110 Notice of allowance mailed Jun. 09, 2004, 8 pgs.

U.S. Appl. No. 10/179110 Response filed Mar. 11, 2004 to Non final office action mailed Dec. 11, 2003, 6 pgs.

U.S. Appl. No. 10/179110 Response filed Sep. 17, 2003 to Non final office action mailed Jun. 17, 2003, 12 pgs.

U.S. Appl. No. 10/179151 Amendment and response filed Jun. 30, 2003 to Non final office action mailed Mar. 31, 2003, 14 pgs.

U.S. Appl. No. 10/179151 Amendment and response filed Sep. 09, 2004 to Final office action mailed Jul. 09, 2004, 17 pgs.

U.S. Appl. No. 10/179151 Final office action mailed Jul. 09, 2004, 13 pgs.

U.S. Appl. No. 10/179151 Non Final office action mailed Jan. 05, 2004, 15 pgs.

U.S. Appl. No. 10/179151 Non Final office action mailed Mar. 31, 2003, 17 pgs.

U.S. Appl. No. 10/179151 Notice of allowance mailed Oct. 12, 2004, 7 pgs.

U.S. Appl. No. 10/179110 Response filed Apr. 05, 2004 to Non final office action mailed Jan. 05, 2004, 14 pgs.

U.S. Appl. No. 10/929632 Amendment and response filed Oct. 04, 2006 to Final office action mailed Aug. 04, 2006, 13 pgs.

U.S. Appl. No. 10/929632 Final office action mailed Aug. 02, 2007, 10 pgs.

U.S. Appl. No. 10/929632 Final office action mailed Aug. 04, 2006, 12 pgs.

U.S. Appl. No. 10/929632 Non Final office action mailed Feb. 20, 2007, 10 pgs.

U.S. Appl. No. 10/929632 Non Final office action mailed Mar. 01, 2006, 15 pgs.

U.S. Appl. No. 10/929632 Response filed May 14, 2007 to Non Final office action mailed Feb. 20, 2007, 15 pgs.

U.S. Appl. No. 10/929632 Response filed Jun. 01, 2006 to Non Final office action mailed Mar. 01, 2006, 16 pgs.

U.S. Appl. No. 10/930252 Non Final office action mailed Feb. 23, 2007, 10 pgs.

U.S. Appl. No. 10/930252 Notice of allowance mailed Jul. 11, 2007, 10 pgs.

U.S. Appl. No. 10/930252 Response filed May 23, 2007 to Non Final office action mailed Feb. 23, 2007, 8 pgs.

U.S. Appl. No. 09/382929 final office action mailed Dec. 10, 2002, 11 PGS.

U.S. Appl. No. 09/382929 final office action mailed Jun. 01, 2007, 11 PGS.

U.S. Appl. No. 09/382929 final office action mailed Jul. 11, 2005, 18 PGS.

U.S. Appl. No. 09/382929 non/final office action mailed Jan. 21, 2005, 8 PGS.

U.S. Appl. No. 09/382929 non/final office action mailed Dec. 22, 2005, 11 PGS.

U.S. Appl. No. 09/382929 non/final office action mailed Apr. 16, 2004, 7 PGS.

U.S. Appl. No. 09/382929 non/final office action mailed Jun. 14, 2002, 2 PGS.

U.S. Appl. No. 09/382929 non/final office action mailed Jul. 13, 2006, 10 PGS.

U.S. Appl. No. 09/382929 Response filed Oct. 11, 2006 to non/final office action mailed Jul. 13, 2006, 23 PGS.

U.S. Appl. No. 09/382929 Response filed Apr. 10, 2003 to final office action mailed Dec. 10, 2002, 14 PGS.

U.S. Appl. No. 09/382929 Response filed Sep. 12, 2005 to final office action mailed Jul. 11, 2005, 18 PGS.

U.S. Appl. No. 09/382929 Response filed Sep. 16, 2002 to final office action mailed Jun. 14, 2002, 6 PGS.

U.S. Appl. No. 09/382929 Response filed Apr. 20, 2005 to non/final office action mailed Jan. 21, 2005, 18 PGS.

U.S. Appl. No. 09/382929 Response filed Apr. 24, 2006 to non/final office action mailed Dec. 22, 2005, 20 PGS.

U.S. Appl. No. 09/382929 Response filed Jul. 14, 2004 to non/final office action mailed Apr. 16, 2004, 14 PGS.

U.S. Appl. No. 09/382,929 Final Office Action mailed Feb. 10, 2002.

U.S. Appl. No. 09/382,929 Final Office Action mailed Jun. 01, 2007.

U.S. Appl. No. 09/382,929 Final Office Action mailed Jul. 11, 2005.

U.S. Appl. No. 09/382,929 Non/Final Office Action mailed Apr. 16, 2004.

U.S. Appl. No. 09/382,929 Non/Final Office Action mailed Jun. 14, 2002. pdf.

U.S. Appl. No. 09/382,929 Non/Final Office Action mailed Jul. 13, 2006.

U.S. Appl. No. 10/930,252 Notice of Allowance mailed Jun. 11, 2007, 10 pgs.

U.S. Appl. No. 10/931,510 non/final office action mailed Dec. 22, 2005, 10 pgs.

U.S. Appl. No. 10/931,510 non/final office action mailed Apr. 11, 2007, 14 pgs.

U.S. Appl. No. 10/931,510 non/final office action mailed Sep. 18, 2006, 24 pgs.

U.S. Appl. No. 10/931,510 Notice of Allowance mailed Sep. 24, 2007, 5 pgs.

U.S. Appl. No. 10/931,510 Response filed Apr. 24, 2006 to non/final office action mailed Dec. 22, 2005, 19 pgs.

U.S. Appl. No. 10/931,510 Response filed Jul. 11, 2007 to non/final office action mailed Apr. 11, 2007, 13 pgs.

U.S. Appl. No. 10/931510 Response filed Jan. 18, 2007 to non/final office action mailed Sep. 18, 2006, 30 pgs.

U.S. Appl. No. 11/482308 Notice of allowance mailed Jul. 23, 2007, 4 PGS.

U.S. Appl. No. 11/001,930 non/final office action mailed Aug. 16, 2006, 12 PGS.

U.S. Appl. No. 11/001,930 Notice of allowance mailed Nov. 30, 2006, 2 PGS.

U.S. Appl. No. 11/001,930 Response filed Nov. 6, 2006 to non/final office action mailed Aug. 16, 2006, 12 PGS.

U.S. Appl. No. 11/216,486 Final Office Action mailed Aug. 02, 2007, 10.

U.S. Appl. No. 11/529,157 Non/Final Office Action mailed Sep. 27, 2007, 12 pgs.

* cited by examiner

PACKAGING OF ELECTRONIC CHIPS WITH AIR-BRIDGE STRUCTURES

RELATED APPLICATIONS

This application is a Divisional of U.S. application Ser. No. 10/931,510 filed Sep. 1, 2004, which is a Divisional of U.S. application Ser. No. 09/382,929, filed Aug. 25, 1999, which are incorporated herein by reference.

FIELD OF THE INVENTION

This invention relates to the packaging of electronic chips, and more particularly to the packaging of electronic chips having air-bridge structures.

BACKGROUND OF THE INVENTION

As the density of devices, such as resistors, capacitors, and transistors, in an integrated circuit is increased, the distance between the signal carrying conductors is decreased, and the capacitive coupling between the conductors is increased. Several problems result from the increased capacitive coupling. First, the increased capacitive coupling reduces the rate at which information can be transferred along each of the signal carrying conductors. Second, the increased capacitive coupling between the signal carrying conductors reduces the noise margin on the conductors. In the worst case, a signal on one signal carrying conductor is capacitively coupled to an adjacent signal carrying conductor, and the information on the adjacent conductor is destroyed. Since it is desirable to avoid destroying information, it is also desirable to reduce the capacitive coupling between the signal carrying conductors of an integrated circuit.

In an integrated circuit, decreasing the dielectric constant of an insulator that separates two adjacent signal carrying conductors reduces the capacitive coupling between the two adjacent signal carrying conductors. Silicon dioxide is the most commonly used insulator in the fabrication of integrated circuits and has a relatively high dielectric constant of about four. Carbon dioxide has a smaller dielectric constant than silicon dioxide, so replacing silicon dioxide with carbon dioxide reduces the capacitive coupling between the two adjacent conductors. Unfortunately, the thermal conductivity of carbon dioxide is much less than the thermal conductivity of silicon dioxide. This lower thermal conductivity causes a reduction in the rate at which heat is conducted away from an integrated circuit chip that employs a carbon dioxide insulator, which can result in the catastrophic failure of the integrated circuit.

Air has a dielectric constant of one, which is less than the dielectric constant of carbon dioxide and much less than the dielectric constant of silicon dioxide. Replacing silicon dioxide with air in an integrated circuit reduces the capacitive coupling between signal carrying conductors. Air bridge structures, which are structures consisting primarily of signal carrying conductors surrounded by air in an integrated circuit, are fabricated to reduce the dielectric constant in the conductive structures of an integrated circuit. Unfortunately, since, in an air bridge structure, the signal carrying conductors are no longer embedded in a layer of silicon dioxide, the structural integrity of the integrated circuit is decreased. This problem is especially significant when an integrated circuit fabricated using air bridge structures is packaged as a flip chip, For these an other reasons there is a need for the present invention.

SUMMARY OF THE INVENTION

The above mentioned problems with air bridge structures, closely spaced conductors, silicon dioxide insulators and other problems are addressed by the present invention and will be understood by reading and studying the following specification.

A circuit assembly for fabricating an air bridge structure and a method of fabricating an integrated circuit package capable of supporting an air bridge structure is disclosed. A circuit assembly comprises an electronic chip and a conductive structure embedded in a plurality of materials having a plurality of vaporization temperatures. The plurality of materials are formed on the electronic chip and the conductive structure is coupled to the electronic chip.

A method of forming an air bridge structure comprising a plurality of operations is also disclosed. First, a support structure including interstices is formed on an electronic chip. Next, the interstices of the support structure are filled with a material having a vaporization temperature that is less than the vaporization temperature of the support structure. Conductive structures are embedded in the support structure and the material, and a connective structure is mounted on the support structure. Finally, the material is removed from the support structure.

DETAILED DESCRIPTION OF THE PREFERRED EMBODIMENTS

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

Figure 1:
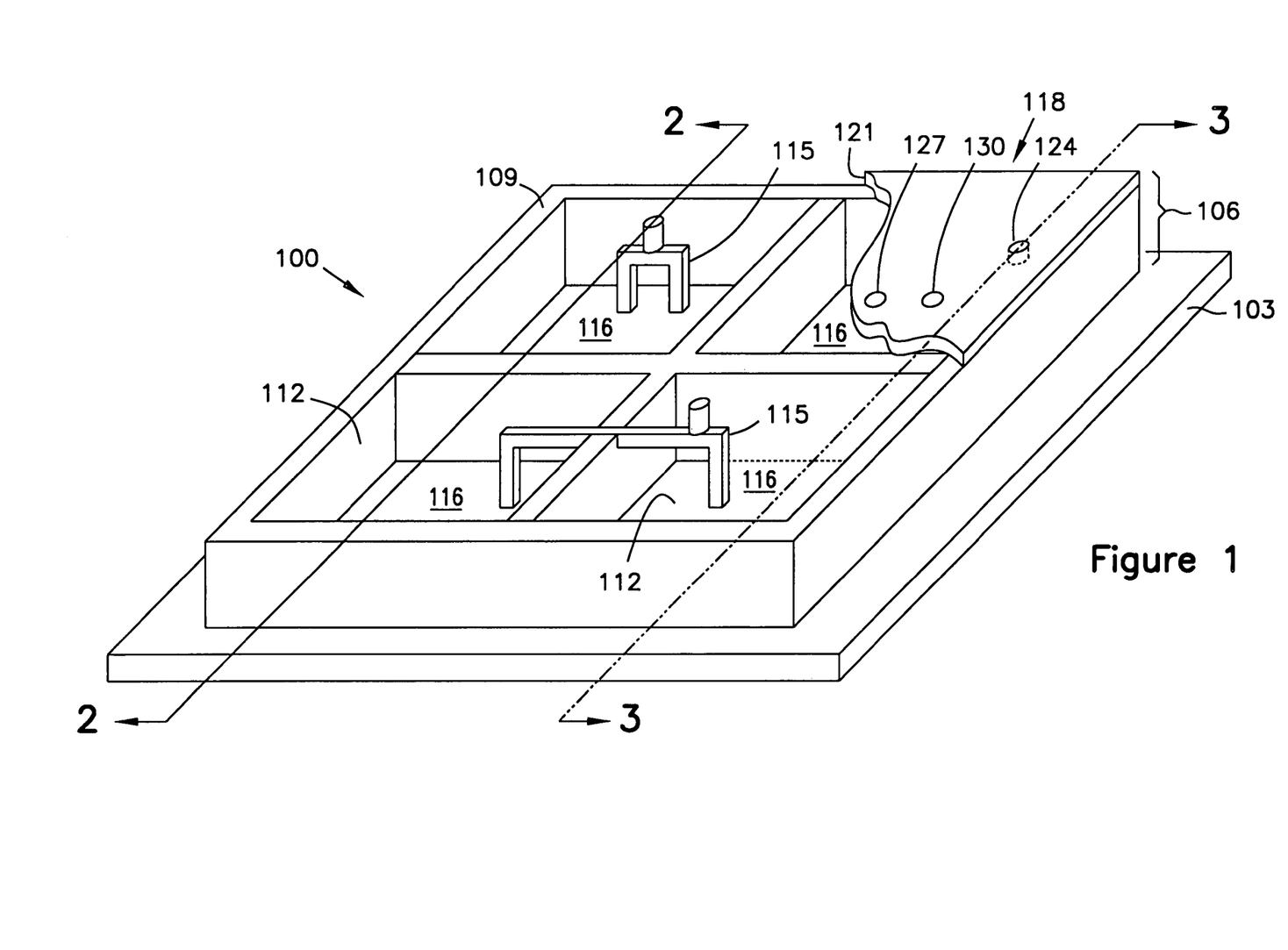
FIG. 1 is a cutaway perspective view of some embodiments of an integrated circuit assembly employing a ribbed support structure of the present invention.

FIG. 1 is a cutaway perspective view of some embodiments of integrated circuit assembly 100 of the present invention. Integrated circuit assembly 100, in one embodiment, includes electronic chip 103, and material layer 106, comprising ribbed support structure 109, fill material 112, conductive structure 115, and interstices 116. In an alternate embodiment, integrated circuit assembly 100 also includes controlled collapse chip connection (C4) structure 118 comprising insulation layer 121, vaporization plug 124, and conductive elements 127 and 130.

Integrated circuit assembly 100 is not limited to use in connection with a particular type of electronic chip 103. Memory chips, such as a dynamic random access memory (DRAM) chips, static random access memory (SRAM) chips, read-only-memory (ROM) chips, and random access memory (RAM) chips, microprocessor chips, logic chips, digital signal processing chips, analog signal processing chips, and application specific integrated circuit (ASIC) chips can all be used in connection with integrated circuit assembly 100.

Material layer 106 is fabricated on the surface of electronic chip 103, and has a plurality of vaporization temperatures. In one embodiment, material layer 106 is fabricated from a plurality of materials in which each of the plurality of materials has a different vaporization temperature.

Material layer 106 includes a structural component, such as ribbed structure 109, and a non-structural component, such as fill material 112. An advantage of using a structural component in the present invention is that the structural component is easily modified to support flip-chip mounting or silicon on substrate mounting of electronic chip 103, without interfering with the layout of the air-bridge structures. Ribbed structure 109 is designed to support the entire weight of electronic chip 103, if electronic chip 103 is mounted using a C4 or flip-chip interconnect. If electronic chip 103 is not mounted using as a C4 or flip-chip interconnect, then the design of ribbed structure 109 is only required to support long run air bridge structures. Ribbed structure 109, in one embodiment, is fabricated by forming a layer of inorganic material, such as $SiO_2$, $Si_3N_4$, or a low temperature $SiO_2$, on the surface of electronic chip 103. The layer of inorganic material is formed to a depth equal to the distance between the surface of electronic chip 103 and the first wiring layer of electronic chip 103. The surface of the layer of inorganic material is patterned and etched to form ribbed structure 109.

Fill material 112 is a non-structural component, and in one embodiment, is a polymer, such as a photoresist or a polyimide. Preferably, fill material 112 is carbon, which has a vaporization temperature of about 400 degrees centigrade, and is deposited in interstices 116 or the etched areas of ribbed structure 109 by sputtering. Fill material 112 is patterned and etched to form a template for the vertical wiring vias and the horizontal interconnect paths of conductive structure 115. In one embodiment, conductive structure 115 is fabricated using the dual damascene process. ("Process for Fabricating Multi-Level Integrated Circuit Wiring Structure from a Single Metal Deposit", John E. Cronin and Pei-ing P. Lee, U.S. Pat. No. 4,962,058, Oct. 9, 1990, is incorporated by reference.) Alternatively, a single damascene or a subtractive etch process sequence is used to produce conductive structure 115. Conductive structure 115 is formed by depositing a conductive material, such as aluminum, gold, silver, or copper, or an alloy of aluminum, gold, silver, or copper, in the vertical wiring vias and conductive interconnect paths of the template formed in fill material 112. The conductive vias couple conductive structure 115 to electronic chip 103. Excess conductive material is removed by a planarizing process, such as chemical mechanical polishing (CMP), applied to the surface of fill material 112 and ribbed structure 109. After CMP, the surface of fill material 112, ribbed structure 109, and conductive structure 115, including the conductive vias and conductive interconnects, are ready for coupling to C4 structure 118.

Variations of the process described above include fabricating material layer 106 from an organic material or a mix of organic materials and inorganic materials, and patterning and etching the surface of material layer 106 to form a post structure. In addition, the process described for forming air bridge structures and support structures can be repeated to form as many wiring levels as required for the design of a particular electronic chip 103.

C4 structure 118, comprising insulation layer 121, vaporization plug 124, and conductive elements 127, is formed above ribbed structure 109 and fill material 112. Insulation layer 121 is the base of C4 structure 118 and is fabricated from an insulator, such as $SiO_2$ or $Si_3N_4$. After forming insulation layer 121, vias are patterned and etched at via sites 127 and 130. A conductor, such as aluminum, gold, copper, or silver, or an alloy of aluminum, gold, copper, or silver, is deposited to fill via sites 127 and 130, and the metal is polished back to the surface of ribbed support structure 109 and fill material 112. Finally, a vaporization plug site is etched in insulation layer 121, and a fill material 112, such as carbon, is deposited to form vaporization plug 124. Any excess carbon is removed by polishing back the carbon to the surface of ribbed structure 109 and fill material 112.

Integrated circuit assembly 100 is placed in a furnace to vaporize fill material 112, leaving air bridge-structure 115, C4 structure 118, and electronic chip 103. In one embodiment, the furnace has an $O_2$ atmosphere heated to about 400 degrees centigrade. In an alternate embodiment, integrated circuit assembly 100 is mounted as a flip chip on a substrate prior to vaporizing fill material 112.

Figure 2A:
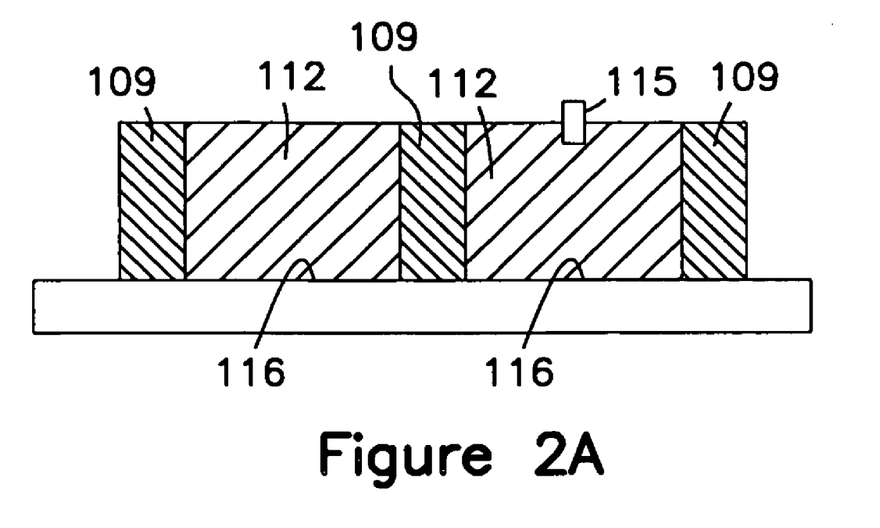
FIG. 2A is a cross-sectional view of the integrated circuit assembly of FIG. 1 along the section line 2.

FIG. 2A is a cross-sectional view along the section line 2 of the integrated circuit assembly of FIG. 1. Conductive structure 115 is formed in and above fill material 112. After fill material 112, which fills interstices 116 formed by ribbed support structure 109, is vaporized, conductive structure 115 is surround by a dielectric having a dielectric constant of about 1.

Figure 2B:
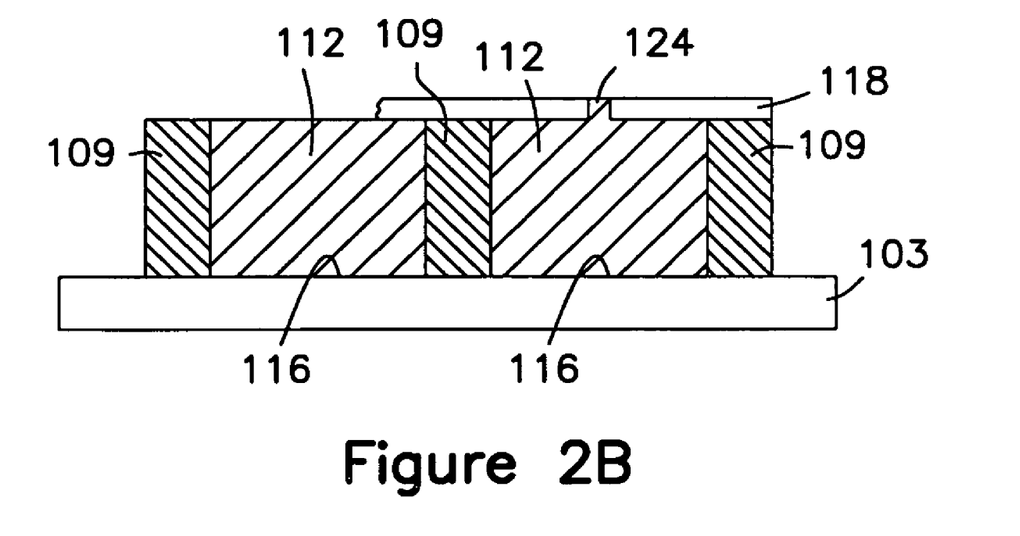
FIG. 2B is a cross-sectional view of the integrated circuit assembly of FIG. 1 along the section line 3.

FIG. 2B is a cross-sectional view along the section line 3 of the integrated circuit assembly of FIG. 1. Support structure 109 having interstices 116 filled with fill material 112 is formed on electronic chip 103. Vaporization plug 124 is formed in fill material 112 and C4 structure 118. In one embodiment, vaporization plug 124 is fabricated from carbon. After heating integrated circuit assembly 100 in an $O_2$ atmosphere at a temperature of about 400 degrees centigrade, carbon fill material 112 and vaporization plug 124 are vaporized and the gas produced by the vaporization process expands through vaporization plug 124.

Figure 3:
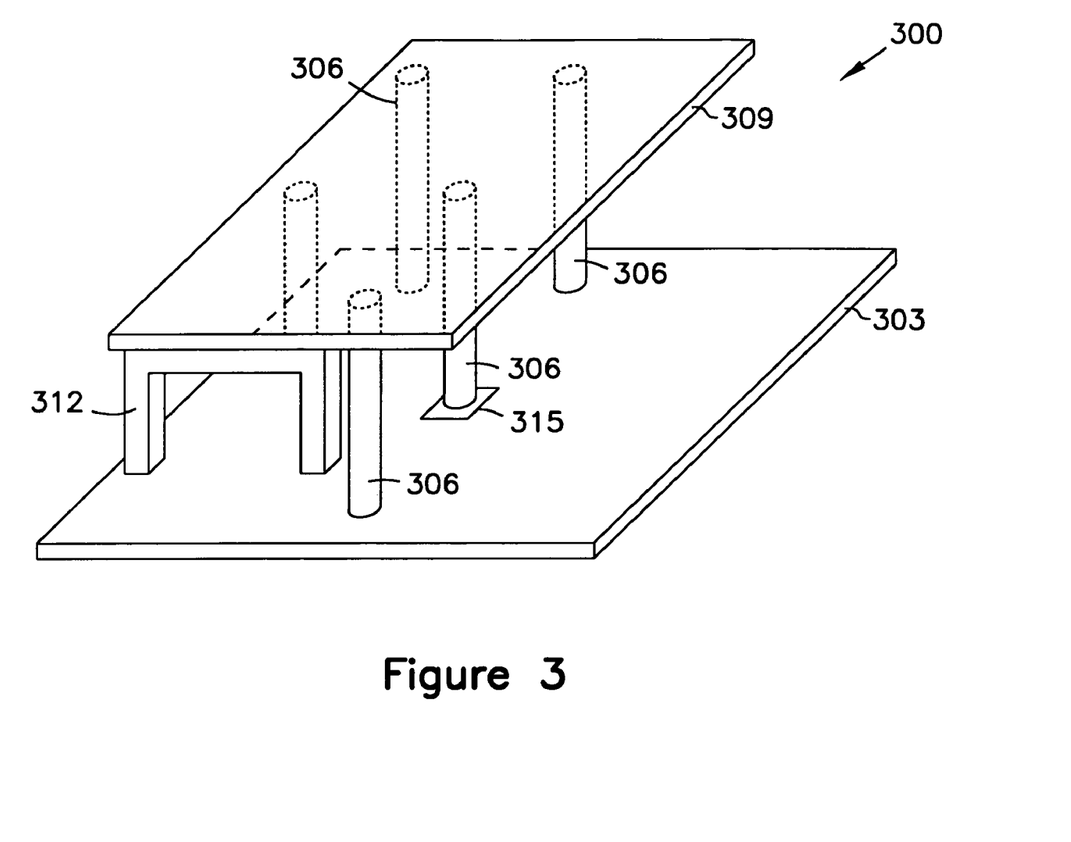
FIG. 3 is a perspective view of some embodiments of an integrated circuit assembly of the present invention employing a post support structure.

FIG. 3 is a perspective view of some alternate embodiments of an integrated circuit assembly 300. Integrated circuit assembly 300 comprises electronic chip 303, a plurality of post support structures 306, connective structure 309, and conductive structure 312.

Integrated circuit assembly 300 is not limited to use in connection with a particular type of electronic chip 303. The electronic chips described as suitable for use in connection with integrated circuit assembly 100 of FIG. 1 are also suitable for use in connection with integrated circuit assembly 300.

The plurality of post support structures 306, in one embodiment, is formed from an inorganic material, such as $SiO_2$ or $Si_3N_4$. The processes described above for fabricating ribbed support structures 109 of FIG. 1 can be applied to the fabrication of post support structures 306. Alternatively, the plurality of support structures 306 are formed from a conductor, such as aluminum, silver, gold or copper, or an alloy of aluminum, silver, gold or copper. When fabricated from a conductor or an alloy of a conductor, the plurality of post support structures 306 are formed on an insulating base 315 to ensure that the plurality of post support structures 306 do not directly couple to, load, or otherwise electronically interfere with the operation of the circuits formed on electronic chip 303.

To fabricate the plurality of post support structures 306 from a conductor, a layer of material is formed above electronic chip 303. In one embodiment, the layer of material is an organic material, such as carbon. Alternatively, the layer of material is an organic polymer. The layer of material is patterned and etched to form a template for the first level vertical wiring and the plurality of post support structures 306. The template for the vertical wiring and the plurality of post support structures 306 are filled with a conductive material to form the plurality of support structures 306 and the vertical wiring for conductive structure 312. Excess conductive material on the surface of the layer of material deposited above electronic chip 303 is removed by chemical mechanical polishing or a similar planarizing process. An advantage of forming post support structures 306 from a conductor is that post support structures 306 provide a thermally conductive path to the C4 surface.

To form a first level air-bridge conductive segment, a horizontal pattern is patterned and etched. A conductive material, such as gold, copper, aluminum, or silver, or an alloy of gold, copper, aluminum, or silver, is deposited to fill the etched pattern. Excess conductive material is planarized back to the level of the surface of the organic material. The operations described above for forming an air-bridge level are repeated until the fabrication of the final air-bridge level is completed.

After completion of the fabrication of the final air-bridge level, the support structure for the C4 contacts is formed from a layer of $SiO_2$ or other insulating material. The layer is patterned and etched to leave holes for vertical wiring to the positions of the C4 contacts. A layer of metal is applied to the surface of the $SiO_2$ and the surface is planarized back to the oxide surface leaving the vertical metal conductors flush with the oxide. This vertical wiring level connects the C4 contacts to the last air-bridge level. Additional openings are etched in the oxide such that all the interior carbon or polymer areas are accessible.

The C4 contacts on the surface of electronic chip 303 are reflowed in an $H_2$ atmosphere. Electronic chip 303 is flipped and the C4 contacts are joined to a substrate in an $H_2$ atmosphere. The assembly is placed in a furnace having an $O_2$ atmosphere at approximately 400 degrees centigrade and the carbon is reduced to gaseous $CO_2$. If a polymer is used as the fill material instead of the carbon, the polymer is also removed using an $O_2$ plasma.

If a hermetic packaging is used, the package is back filled with helium to improve the thermal properties of the assembly. If a heat sink is required, it is attached prior to the removal of the carbon support structure.

Figure 4:
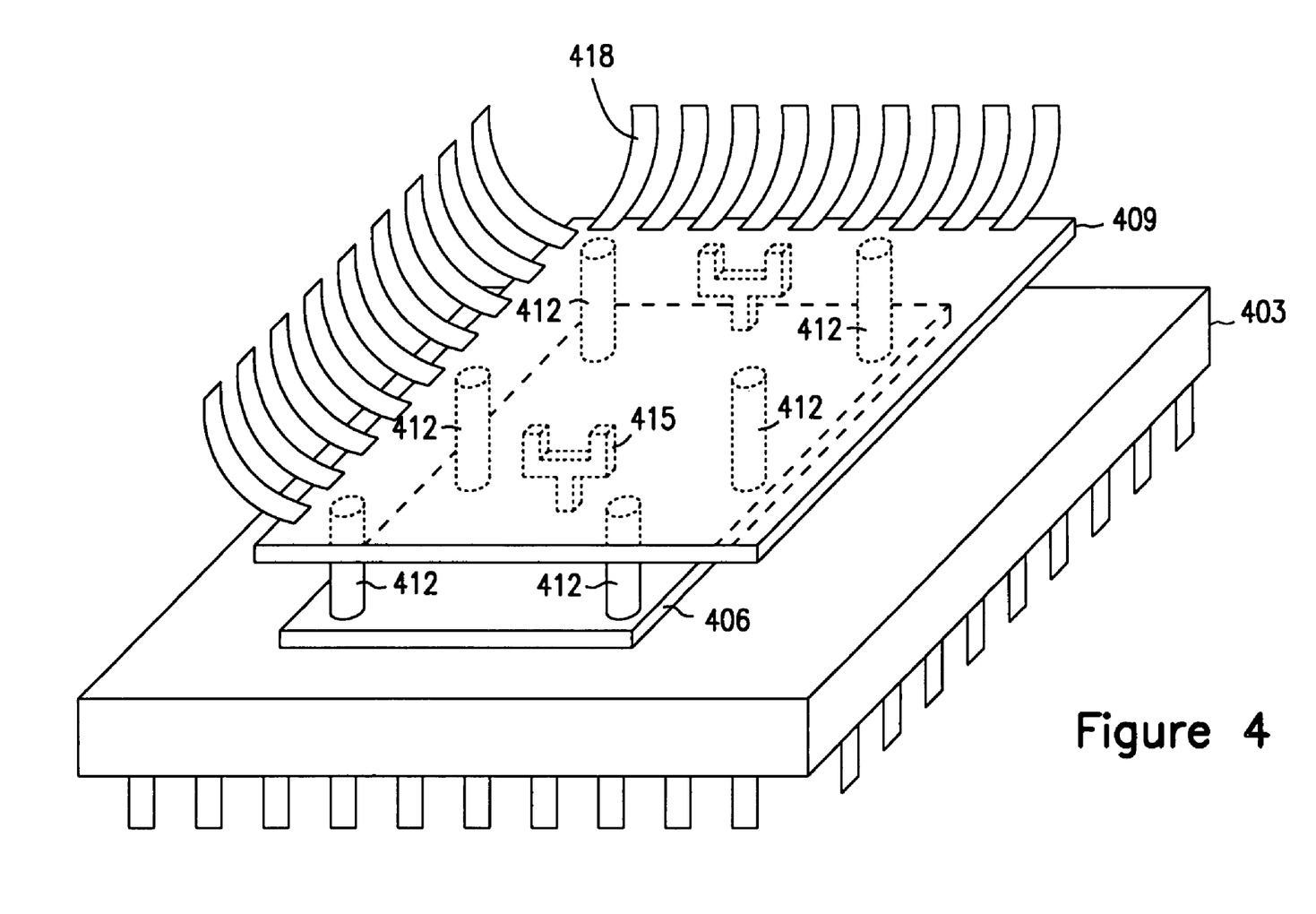
FIG. 4 is a perspective view of some embodiments of an integrated circuit assembly mounted on a substrate.

FIG. 4 is a perspective view of some embodiments of integrated circuit assembly 400. Integrated circuit assembly 400 comprises substrate 403, C4 connective structure 406, electronic chip 409, a plurality of post support structures 412, air-bridge conductive structure 415, and heat sink 418. In assembling integrated circuit assembly 400, electronic chip 409 is fabricated for flip chip mounting using C4 structure 406. A plurality of post support structures 412 and an air-bridge structure 415 are fabricated on electronic chip 406. The plurality of post support structures 412 support electronic chip 409 when mounted as a flip-chip on substrate 403. Heat sink 418 assists in cooling electronic chip 409 by conducting heat away form electronic chip 409. If the fill material in which connective structure 406 is fabricated is not removed from integrated circuit assembly 400 prior to mounting electronic chip 409 on substrate 403, the fill material is removed by heating integrated circuit assembly 400. In one embodiment, integrated circuit assembly 400 is heated in an $O_2$ atmosphere at 400 degrees centigrade. The fill material is vaporized, and air-bridge conductive structure 415 is surround by air having a dielectric constant of about 1. To improve the cooling characteristics of integrated circuit assembly 400, substrate 403 is hermetically sealed and filled with helium or a helium rich gas.

Figure 5A:
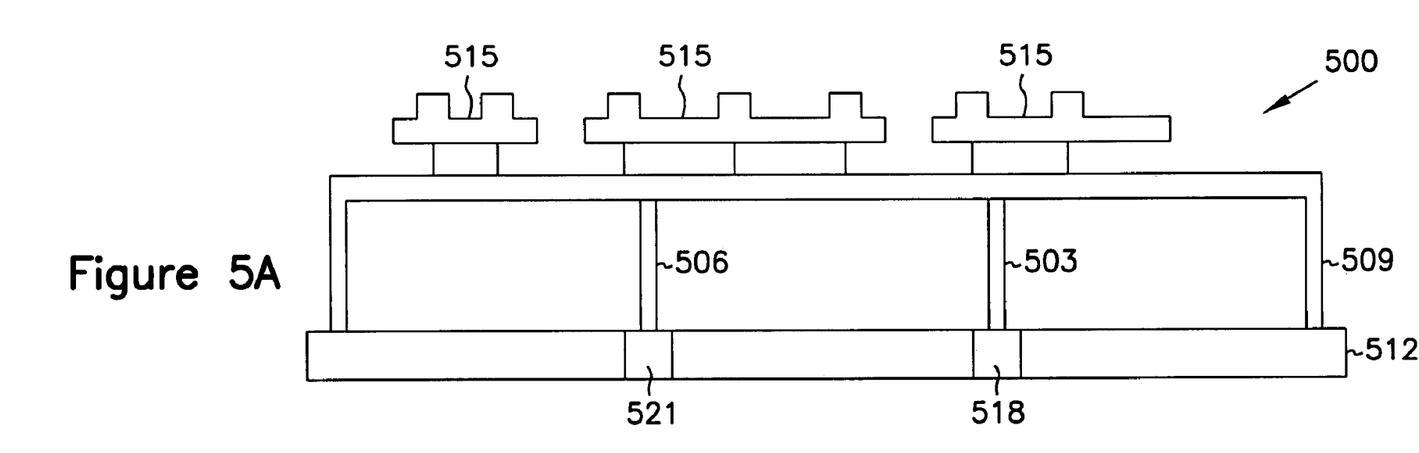
FIG. 5A is a simplified schematic of an air-bridge structure supported by conductive posts.

FIG. 5A is a simplified schematic of air-bridge structure 500 supported by conductive posts 503 and 506. Long run air-bridge conductive structure 509 couples electronic devices embedded in electronic chip 512. Conductive posts 503 and 506 support long run air-bridge conductive structure 509 and C4 connective structure 515. Conductive posts 503 and 506 are terminated in insulators 518 and 521 at the surface of electronic chip 512. An advantage fabricating conductive support posts 503 and 506 from a conductive material, such as aluminum, copper, gold, or silver, or an alloy of aluminum copper, gold, or silver is that conductive support posts 503 and 506 are fabricated at the same time that air-bridge conductive structure 509 is fabricated.

Figure 5B:
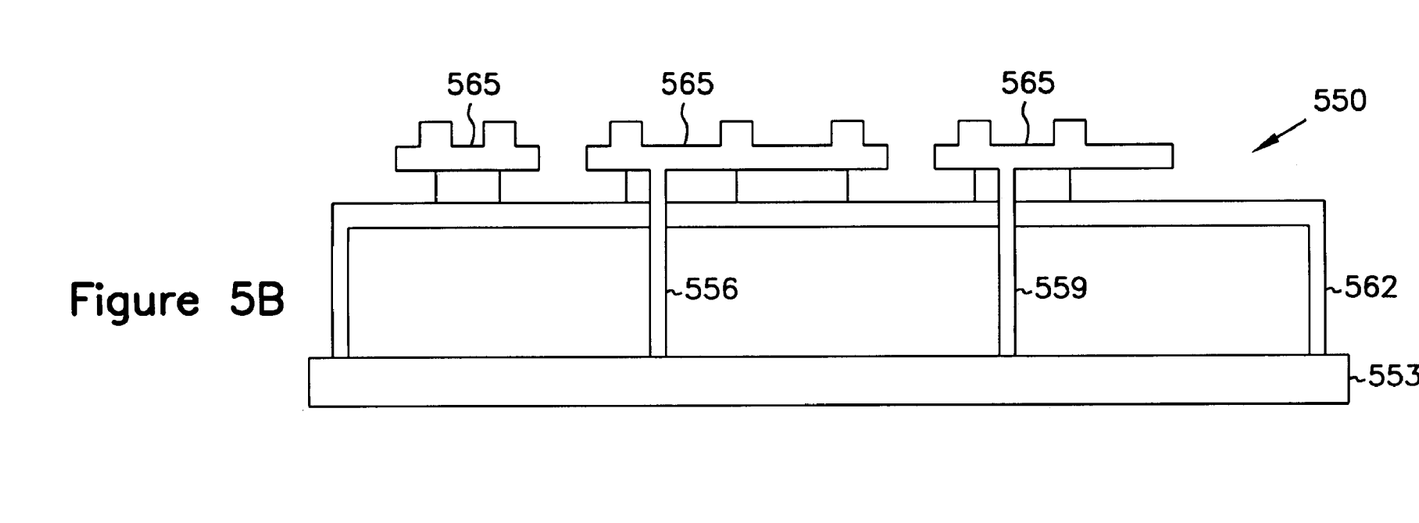
FIG. 5B is a simplified schematic of an air-bridge structure supported by insulating posts.

FIG. 5B is a simplified schematic of air-bridge structure 550 coupling devices embedded in electronic chip 553 and supported by insulating posts 556 and 559. Insulating posts 556 and 559, in one embodiment, are fabricated from silicon dioxide. Insulating posts 556 and 559 support long run air bridge structure 562 and support C4 connective structure 565. The fabrication of long run air bridge structure 562 and C4 connective structure 565 are described above in connection with FIG. 3 and FIG. 4.

Figure 6:
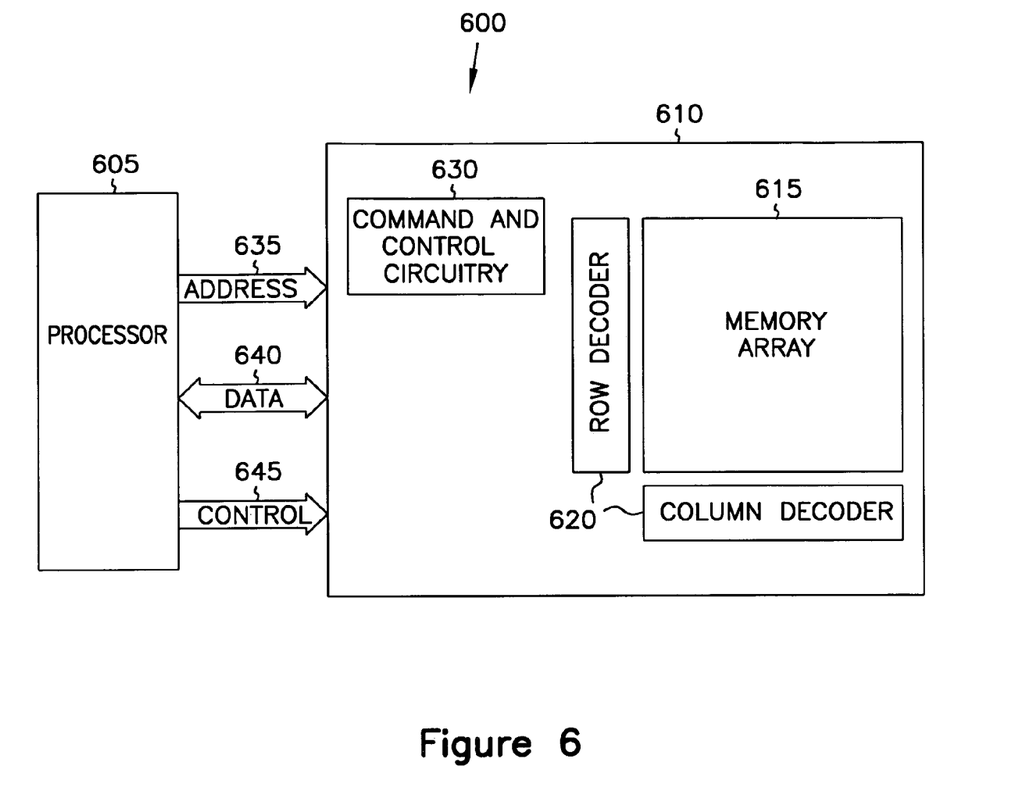
FIG. 6 is a block diagram of a computer system suitable for use in connection with the present invention.

FIG. 6 a block diagram of a computer system 400 suitable for use in connection with the present invention. System 600 comprises processor 605 and memory device 610, which includes an integrated circuit assembly of one or more of the types described above in conjunction with FIGS. 1-3. Memory device 610 comprises memory array 615, address circuitry 620, and read circuitry 630, and is coupled to processor 605 by address bus 635, data bus 640, and control bus 645. Processor 605, through address bus 635, data bus 640, and control bus 645 communicates with memory device 610. In a read operation initiated by processor 605, address information, data information, and control information are provided to memory device 610 through busses 635, 640, and 645. This information is decoded by addressing circuitry 620, including a row decoder and a column decoder, and read circuitry 630. Successful completion of the read operation results in information from memory array 615 being communicated to processor 605 over data bus 640.

CONCLUSION

An integrated circuit assembly having air-bridge structures and a method for manufacturing an integrated circuit assembly having air-bridge structures has been described. An integrated circuit assembly includes structural components that protect the air-bridge structures during flip-chip mounting. A method of fabricating an electronic chip compatible with flip-chip mounting techniques includes the fabrication of ribbed support structures and post support structures. The support structures are fabricated from either insulating or conductive materials.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A method comprising:
   fabricating a plurality of electronic devices on a substrate;
   embedding a wiring structure in a plurality of materials having a plurality of vaporization temperatures, the plurality of materials is located on the substrate and the wiring structure interconnects the plurality of electronic devices;
   mounting an integrated circuit on a packaging substrate; and
   removing at least one of the plurality of materials after the integrated circuit is mounted on the packaging substrate.

2. The method of claim 1, further comprising:
   attaching a C4 structure to the integrated circuit prior to mounting the integrated circuit on the packaging substrate.

3. The method of claim 2, wherein removing at least one of the plurality of materials after the integrated circuit is mounted on the packaging substrate comprises:
   heating the integrated circuit.

4. The method of claim 3, wherein heating the integrated circuit comprises:
   placing the integrated circuit in a furnace having an oxygen atmosphere heated to about 400 degrees centigrade.

5. A method comprising:
   forming an air bridge structure including:
      forming a support structure having a support structure vaporization temperature and having interstices on an electronic chip;
      filling the interstices of the support structure with a fill material having a vaporization temperature that is less than the support structure vaporization temperature;
      embedding a conductive structure in the support structure and the fill material, wherein embedding the conductive structure includes forming the conductive structure having a horizontal conductive interconnect and at least one vertical wiring via coupling the horizontal conductive interconnect to the electronic chip, and wherein the horizontal conductive interconnect is formed in contact with and above the fill material;
      mounting a connective structure on the support structure; and
      removing the fill material.

6. The method of claim 5, wherein forming a support structure having a support structure vaporization temperature and having interstices on an electronic chip comprises:
   depositing a layer of silicon dioxide on the electronic chip; and
   etching the layer of silicon dioxide to form the support structure having interstices.

7. A method comprising:
   forming an air bridge structure including:
      forming a support structure having interstices on an electronic chip;
      filling the interstices of the support structure with a fill material having a vaporization temperature that is less than the vaporization temperature of the support structure;
      embedding a conductive structure in the fill material, wherein embedding the conductive structure includes forming the conductive structure having a horizontal conductive interconnect and at least one vertical wiring via coupling the horizontal conductive interconnect to the electronic chip, and wherein the horizontal conductive interconnect is formed in contact with and above the fill material;
      mounting a connective structure on the support structure; and
      vaporizing the fill material.

8. The method of claim 7, wherein filling the interstices of the support structure with a fill material having a vaporization temperature that is less than the vaporization temperature of the support structure comprises:
   depositing a layer of carbon on the electronic chip.

9. The method of claim 8, wherein depositing a layer of carbon on the electronic chip comprises: sputtering the layer of carbon on the electronic chip.

10. The method of claim 9, further comprising: planarizing the layer of carbon.

11. A method comprising:
    fabricating an integrated circuit structure including a conductive structure and a ribbed support structure embedded in a fill material;
    mounting controlled collapse chip connection pads on the integrated circuit structure;
    mounting the integrated circuit structure on a substrate;
    removing the fill material; and
    backfilling with a gas and hermetically sealing the substrate.

12. The method of claim 11, wherein the gas is helium.

13. The method of claim 11, wherein the fill material is carbon.

14. The method of claim 11, wherein the structural material is $SiO_2$.

15. The method of claim 1, wherein the plurality of materials includes a fill material.

16. The method of claim 15, wherein the fill material includes carbon.

17. The method of claim 1, wherein the plurality of materials includes a support structure.

18. The method of claim 17, wherein the support structure includes $SiO_2$.

19. The method of claim 5, wherein the support structure includes $SiO_2$.

20. The method of claim 5, wherein the fill material includes carbon.

21. The method of claim 7, wherein the support structure includes $SiO_2$.

22. A method comprising:
    forming a material layer on a surface of an electronic chip including a plurality of devices, the material layer having a non-conductive ribbed structure having a depth and forming at least one interstice;
    forming within the material layer a plurality of conductive segments including at least one air-bridge structure having a horizontal conductive interconnect within the material layer and above and not in contact with the surface of the electronic chip,
    forming at least one vertical wiring via coupling the horizontal conductive interconnect to one or more of the plurality of electronic devices;
    forming a controlled collapse chip connection (C4) structure including an insulating layer formed above the ribbed structure, above the conductive segments, and above the interstices, and coupled to the electronic chip through a plurality of conductive elements coupled to one or more of the plurality of conductive segments; and
a substrate coupled to the C4 structure.

23. The method of claim 22, further including: hermetically sealing the at least one interstice.

24. The method claim 23, wherein hermetically sealing the at least one interstice includes:
back filling the at least one interstice with helium.

25. The method claim 23, wherein hermetically sealing the at least one interstice includes:
back filling the at least one interstice with a helium rich gas mixture.

26. The method claim 22, further including:
coupling a heat sink to the substrate.

* * * * *